(12) United States Patent
Hollis

(10) Patent No.: US 6,822,451 B2
(45) Date of Patent: Nov. 23, 2004

(54) NON-COUPLING MAGNETIC SHEILDING COIL

(75) Inventor: Timothy James Hollis, Didcot (GB)

(73) Assignee: GE Medical Systems Global Technology Company LLC, Waukesha, WI (US)

( * ) Notice: Subject to any disclaimer, the term of this patent is extended or adjusted under 35 U.S.C. 154(b) by 140 days.

(21) Appl. No.: 10/064,619

(22) Filed: Jul. 31, 2002

(65) Prior Publication Data

US 2004/0021465 A1 Feb. 5, 2004

(51) Int. Cl.$^7$ ................................................ G01V 3/00
(52) U.S. Cl. ........................................ 324/319; 324/320
(58) Field of Search ................................ 324/319, 320, 324/318, 322, 300

(56) References Cited

U.S. PATENT DOCUMENTS

| | | | |
|---|---|---|---|
| 4,584,548 A | | 4/1986 | Inoue et al. ................ 335/299 |
| 5,113,166 A | | 5/1992 | Miyajima et al. ........... 335/299 |
| 5,168,211 A | * | 12/1992 | Laukien et al. ............. 324/319 |
| 5,280,247 A | * | 1/1994 | DeMeester et al. ......... 324/318 |
| 5,289,128 A | * | 2/1994 | DeMeester et al. ......... 324/318 |
| 5,296,810 A | * | 3/1994 | Morich ....................... 324/318 |
| 5,329,266 A | * | 7/1994 | Soeldner et al. ............ 335/216 |
| 5,721,523 A | * | 2/1998 | Dorri et al. ................. 335/216 |
| 5,812,043 A | * | 9/1998 | Gore et al. .................. 335/216 |

FOREIGN PATENT DOCUMENTS

| | | |
|---|---|---|
| JP | 61163609 A | 7/1986 |
| JP | 62013008 A | 1/1987 |

* cited by examiner

Primary Examiner—Louis Arana
(74) Attorney, Agent, or Firm—Cantor Colburn LLP

(57) ABSTRACT

In this system and method for magnetic resonance imaging, an actively shielded primary coil includes a first and second set of turns each having a prescribed number of turns about an axis, and each being symmetrically positioned radially from the axis and equidistant with respect to a mid plane perpendicular to the axis. A secondary shielding coil includes a third and fourth set of turns each having a prescribed number of turns about the axis and being symmetrically positioned radially from the axis and equidistant with respect to the mid plane. The third set of turns is positioned in close proximity to the first set of turns and outward of the first set of turns. Likewise, the fourth set of turns is positioned in close proximity to the second set of turns and outward of the second set of turns. The first and third sets of turns are in a first prescribed turns ratio and the second and fourth sets of turns are in a second prescribed turns ratio.

12 Claims, 4 Drawing Sheets

NON-COUPLING MAGNETIC SHEILDING COIL

BACKGROUND OF INVENTION

The field of the invention is nuclear magnetic resonance imaging methods and systems. More particularly, the invention relates to a method and system for magnetic resonance imaging magnet assemblies.

Magnetic resonance imaging (MRI) is a diagnostic imaging modality that does not rely on ionizing radiation. Instead, it uses strong (ideally) static magnetic fields, radio-frequency (RF) pulses of energy and magnetic field gradient waveforms. More specifically, MR imaging is a non-invasive procedure that uses nuclear magnetization and radio waves for producing internal pictures of a subject. Three-dimensional diagnostic image data is acquired for respective "slices" of an area of the subject under investigation. These slices of data typically provide structural detail having a resolution of one (1) millimeter or better.

When utilizing nuclear magnetic resonance (NMR) to produce images, a technique is employed to obtain NMR signals from specific locations in the subject. Typically, the region that is to be imaged (region of interest) is scanned by a sequence of NMR measurement cycles, which vary according to the particular localization method being used. The resulting set of received NMR signals are digitized and processed to reconstruct the image using one of many well-known reconstruction techniques. To perform such a scan, it is, of course, necessary to elicit NMR signals from specific locations in the subject. This is accomplished by employing gradient magnetic fields which have the same direction as a polarizing field, $B_0$, but which are configured as needed to select the slice, phase encode and readout to facilitate the imaging. By controlling the strength of these gradients during each NMR cycle, the spatial distribution of spin excitation can be controlled and the location of the resulting NMR signals can be identified. When a substance such as human tissue is subjected to the uniform magnetic polarizing field, $B_0$, the individual magnetic moments of the spins in the tissue attempt to align with this polarizing field, but precess about it in random order at their characteristic Larmor frequency. If the substance, or tissue, is subjected to a magnetic field (excitation field $B_1$) which is in an x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated, this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Unlike conventional magnets, an actively shielded magnet is unable to automatically compensate (i.e., via Lens's Law) for the magnetic disturbances to the $B_0$ field in the imaging volume due to external magnetic sources. This so because of the actively shielded magnet's combination of positive and negative turns. Thus, the actively shielded magnet only partly compensates for the shift in the $B_0$ field. A $B_0$ coil is a secondary coil added to an actively shielded superconducting magnet to shield the effects of moving metal objects in the vicinity of the magnet. Unfortunately, $B_0$ coils typically have a small mutual inductance with the primary coil and steadily accumulate current as the primary coil decays. This causes a deterioration in the magnetic field homogeneity in the imaging volume, leading to poor imaging quality. A quench in the primary coil can couple extremely high currents into the $B_0$ coil, causing a risk of damage to the $B_0$ coil.

SUMMARY OF INVENTION

The above discussed and other drawbacks and deficiencies are overcome or alleviated by a magnet assembly for a magnetic resonance imaging system. The magnet assembly comprises a primary coil including a first set of turns having a first prescribed number of turns about an axis. The first set of turns is symmetrically positioned radially from the axis and with respect to a mid plane perpendicular to the axis. A second set of turns has a second prescribed number of turns about the axis and is symmetrically positioned radially from the axis and with respect to the mid plane outward of the first set of turns.

A secondary coil includes a third set of turns having a third prescribed number of turns about the axis. The third set of turns is symmetrically positioned radially from the axis and with respect to the mid plane in close proximity to the first set of turns and outward of the first set of turns. A fourth set of turns has a fourth prescribed number of turns about the axis, and is symmetrically positioned radially from the axis and with respect to the mid plane in close proximity to the second set of turns and outward of the second and third sets of turns. The first and third sets of turns are in a first prescribed turns ratio and the second and fourth sets of turns are in a second prescribed turns ratio.

A method of optimizing the mutual inductance between a primary and a secondary coil in a magnetic resonance imaging actively shielded magnet assembly comprises minimizing deterioration in the homogeneity of the polarizing magnetic field for a given rate of change in the decay of the current in the primary coil; and minimizing the rate of change of current in the secondary coil and a shim coil for a given drift in the current in the primary coil.

The secondary coil shields the effects of moving metal objects in the vicinity of the magnet. Using the correct geometry, the $B_0$ shielding function can be performed by a single secondary circuit which is non-coupling with respect to the primary coil. The primary and secondary circuits react to an external disturbance independently, according to Lens' law, to completely cancel a shift in the $B_0$ field in the imaging volume. The primary and secondary coils react independently of one another because there is no mutual inductance between them. Since the primary and secondary coils are non-coupling, the $B_0$ coil does not accumulate current as a result of changes in the primary coil current. The $B_0$ coil is divided into two parts which are electrically wired together in a series configuration. An inner coil is wound onto the positive turns of the primary coil and an outer coil is wound onto the negative turns (bucking coil) of the primary coil.

The above discussed and other features and advantages of the present invention will be appreciated and understood by those skilled in the art from the following detailed description and drawings.

BRIEF DESCRIPTION OF DRAWINGS

Referring to the exemplary drawings wherein like elements are numbered alike in the several Figures.

DETAILED DESCRIPTION

Figure 1:
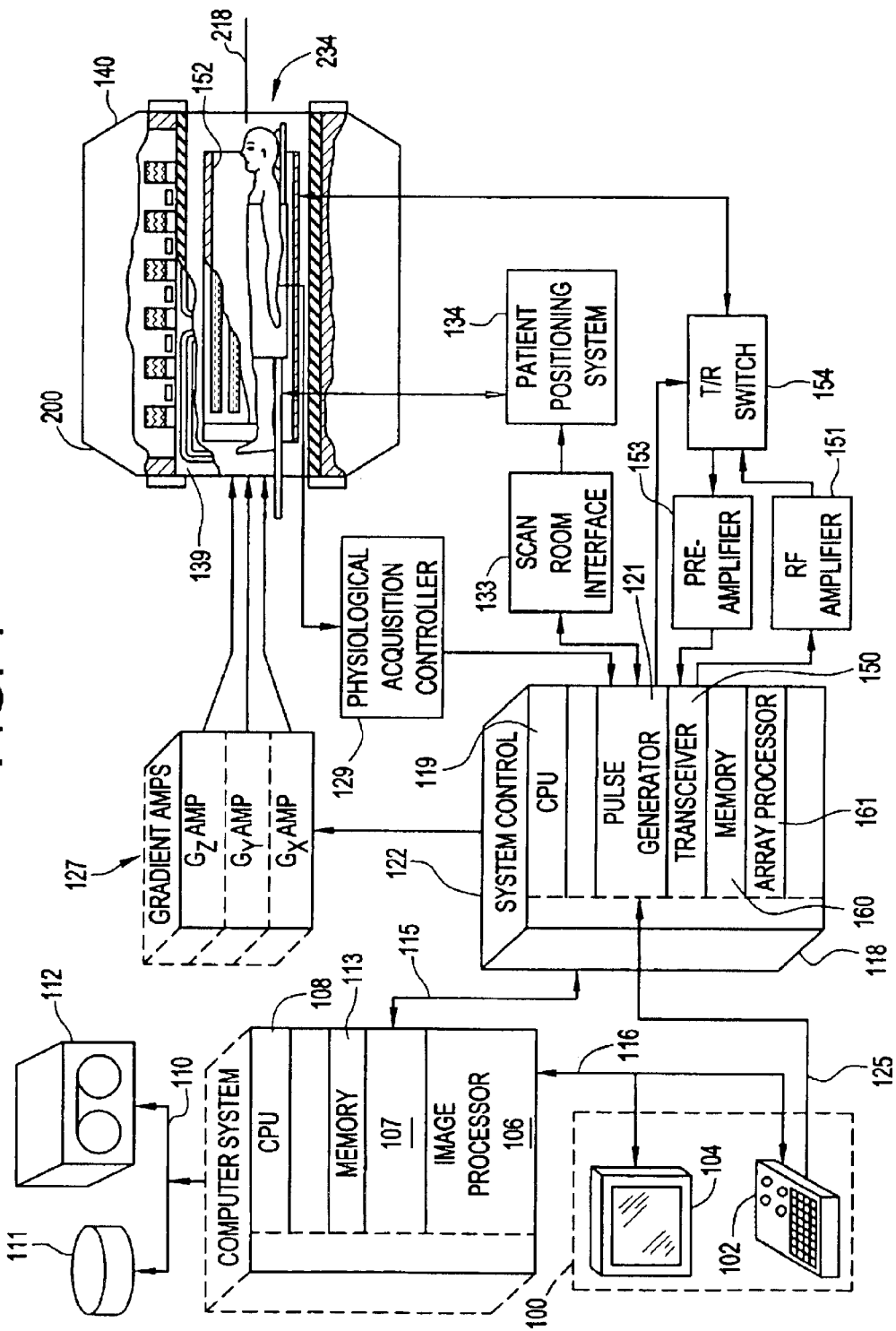
FIG. 1 is an exemplary Magnetic Resonance Imaging system.

Referring to FIG. 1, there is shown the major components of an exemplary MRI system 10, within which an exemplary embodiment may be implemented. The operation of the system is controlled from an operator console 100, which includes a keyboard and control panel 102 and a display screen 104. The console 100 communicates through a link 116 with a separate computer system 107 that enables an operator to control the production and display of images on the screen 104. The computer system 107 includes a number of modules, which communicate with each other through a backplane. These include an image processor module 106, a CPU module 108 and a memory module 113, known in the art as a frame buffer for storing image data arrays. The computer system 107 is linked to storage media 111 and 112, depicted as disk storage and a tape drive respectively for storage of image data and programs, and it communicates with a separate system control 122 through a high speed serial link 115.

The system control 122 includes a set of modules connected together by a backplane 118. These include a CPU module 119 and a pulse generator module 121, which connects to the operator console 100 through a serial link 125. It is through this link 125 that the system control 122 receives commands from the operator that indicate the scan sequence that is to be performed. As will be described in more detail below, the operator enters parameters, which indicate the prescribed scan. From these parameters, a pulse sequence is calculated and downloaded to the pulse generator module 121.

The pulse generator module 121 operates the system components to carry out the desired scan sequence. It produces data, which indicates the timing, strength and shape of RF pulses that are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. Finally, the pulse generator module 121 connects to a scan room interface circuit 133, which receives signals from various sensors associated with the condition of the patient and a magnet system 200. It is also through the scan room interface circuit 133 that a patient positioning system 134 receives commands to move the patient to the desired position for the scan.

The gradient waveforms produced by the pulse generator module 121 are applied to a gradient amplifier 127 comprised of $G_x$, $G_y$, and $G_z$ amplifiers. Each gradient amplifier 127 excites a corresponding gradient coil in an assembly generally designated 139 to produce the magnetic field gradients used for position encoding acquired signals. The gradient coil assembly 139 forms part of the magnet assembly 200, which includes a polarizing magnet 140 and a whole-body RF coil 152. A transceiver module 150 in the system control 122 produces pulses, which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified MR signals are demodulated, filtered, and digitized in the receiver section of the transceiver 150. The transmit/receive switch 154 is controlled by a signal from the pulse generator module 121 to electrically connect the RF amplifier 151 to the RF coil 152 during a transmit mode and to connect the preamplifier 153 during a receive mode. The transmit/receive switch 154 also enables a separate RF coil 152 (for example, a head coil or surface coil) to be used in either the transmit mode or receive mode.

The MR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in a storage medium 111 or 112 such as disk memory or tape drive. The storage medium 111 and 112 could be various storage methodologies, such as disk, static memory, solid state, removable media, and the like, as well as combinations including at least one of the foregoing. In response to commands received from the operator console 100, this image data may be archived on the tape drive, or it may be further processed by the image processor 106, and conveyed to the operator console 100 and presented on the display 104.

Referring still to FIG. 1 the NMR signal produced by the subject is picked up by the receiver coil 152 and applied through the preamplifier 153 to the input of a transceiver 150. The received signal is at or near the Larmor frequency, and this high frequency signal is down converted in a two-step process, which first mixes the NMR signal with a carrier signal and then mixes the resulting difference signal with a reference signal. The down converted NMR signal is applied to the input of an analog-to-digital (A/D) converter, which samples and digitizes the analog signal and applies it to a digital detector and signal processor which produces in-phase (I) values and quadrature (Q) values corresponding to the received NMR signal. The resulting stream of digitized I and Q values of the received signal are output through backplane 118 to the memory module 160 and array processor 161 where they are employed to reconstruct an image.

Figure 2:
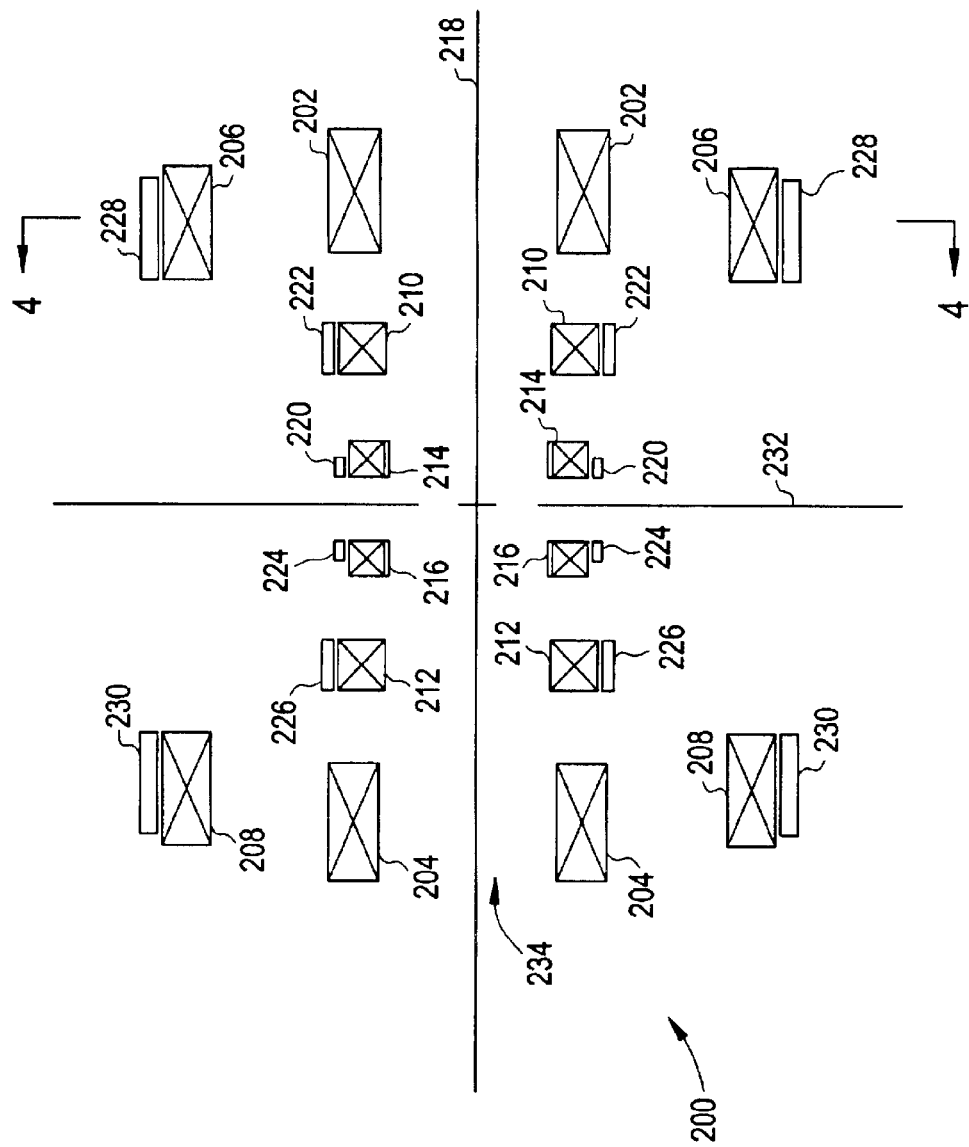
FIG. 2 is a schematic diagram of the arrangement of primary and secondary coils in a magnet assembly of a Magnetic Resonance Imaging system.

Referring to FIG. 2, a cross sectional view of the magnet assembly is shown generally at 200. The magnet assembly 200 comprises a primary coil including a set of positive turns 202, 204, 210, 212, 214, 216 and a set of negative turns 206, 208.

The set of primary coil positive turns 202, 204, 210, 212, 214, 216 are electrically wired in series (see FIG. 3) and are positioned radially symmetric with respect to a longitudinal axis 218.

Figure 3:
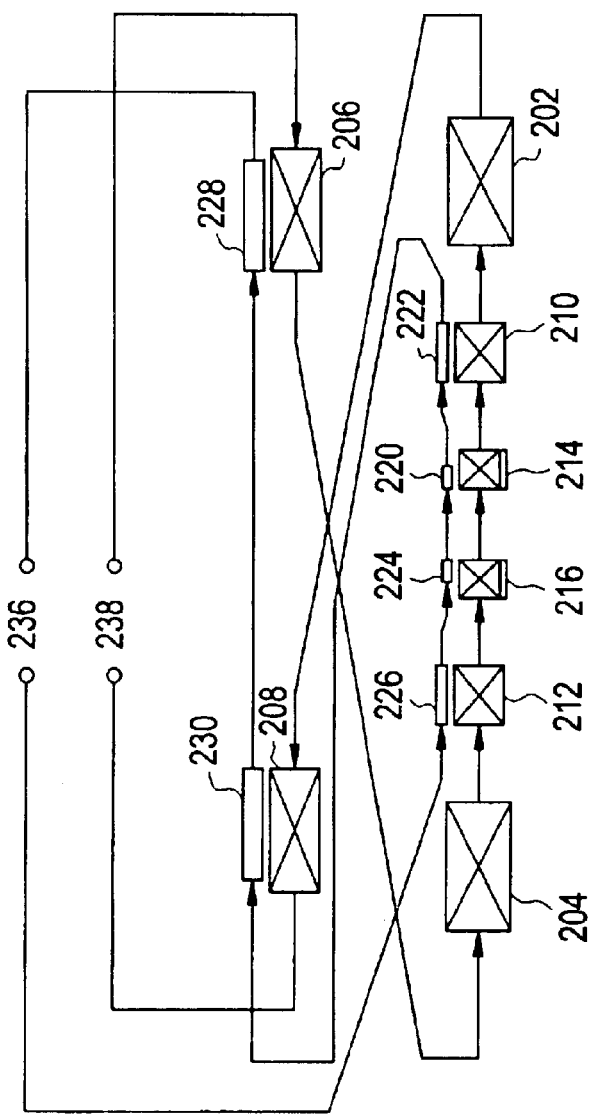
FIG. 3 is a schematic diagram of the series connection of the primary and secondary coils of the magnet assembly of FIG. 2.

In FIG. 3, circuit elements 236 and 238 are superconducting switches comprising a length of superconducting wire (e.g., a non-inductively wound coil) wired across a set of terminals. To add or remove current from the magnet or dump current from the secondary coil, the switches are heated to convert them to a normal or non-superconducting mode.

Figure 4:
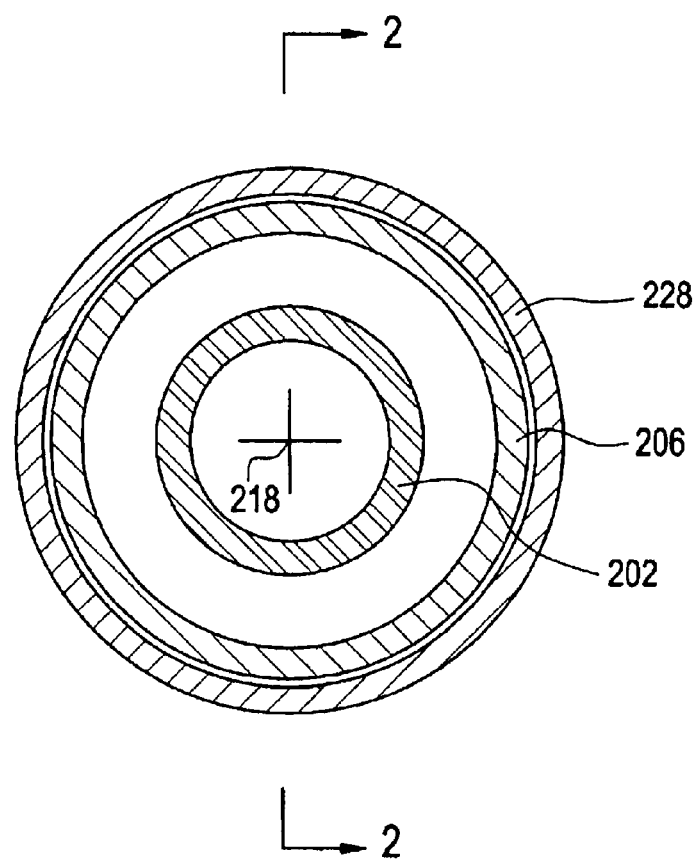
FIG. 4 is an end view of the arrangement of primary and secondary coils in the magnet assembly of FIG. 2.

Further in FIG. 2, the set of primary coil positive turns 202, 204, 210, 212, 214, 216 are further positioned so as to comprise a set of pairs of positive turns 202, 204, 210, 212, 214, 216 symmetric with respect to a mid plane 232. Each segment of the set of primary coil positive turns 202, 204, 210, 212, 214, 216 is wound separately and has a plurality of turns, $N_j$, wound in a predetermined clockwise or counterclockwise direction as viewed along the axis 218 (FIG. 4).

The set of primary coil negative turns 206, 208 are electrically wired in series with the primary coil positive turns 202, 204, 210, 212, 214, 216 (see FIG. 3). The primary coil negative turns 206, 208 are also positioned radially symmetric with respect to the axis 218. The primary coil negative turns 206, 208 are further positioned so as to comprise a set of pairs of negative turns 206, 208 also symmetric with respect to the mid plane 232. Each segment of the set of primary coil negative turns 206, 208 is wound separately and has a plurality of turns, $N_k$, wound in a predetermined counterclockwise or clockwise direction contrary to the clockwise or counterclockwise direction of the primary coil positive 202, 204, 210, 212, 214, 216 turns as viewed along the axis 218 (FIG. 4).

Continuing in FIG. 2, the magnet assembly 200 further comprises a secondary coil ($B_0$ coil) comprising a first set of positive turns 220, 222, 224, 226 and a second set of positive turns 228, 230. The first set of secondary coil positive turns 220, 222, 224, 226, is electrically wired in series (see FIG. 3) and are positioned radially symmetric with respect to the axis 218. The first set of secondary coil positive turns 220, 222, 224, 226 are further positioned so as to comprise a set of pairs of positive turns 220, 222, 224, 226 symmetric with respect to the mid plane 232. The first set of secondary coil positive turns 220, 222, 224, 226 are also positioned in close proximity with and radially outward of the primary coil positive turns 210, 212, 214, 216 in a one-to-one alignment therewith. Each segment of the first set of secondary coil positive turns 220, 222, 224, 226 is wound separately and has a plurality of turns, $N_m$, wound in the same direction as the primary coil positive turns 202, 204, 210, 212, 214, 216.

The second set of secondary coil positive turns 228, 230 is electrically wired in series (see FIG. 3) and are positioned radially symmetric with respect to the axis 218. The second set of secondary coil positive turns 228, 230 are further positioned so as to comprise a set of pairs of turns 228, 230 symmetric with respect to the mid plane 232. The second set of secondary coil positive turns 228, 230 are also positioned in close proximity with and radially outward of the primary coil negative turns 206, 208 in a one-to-one alignment therewith. Each segment of the second set of secondary coil positive turns 228, 230 is wound separately and has a plurality of turns, $N_n$, wired in the opposite polarity to primary coil negative turns 206, 208.

By the passage of electric current through each segment of the first set of secondary coil positive turns 220, 222, 224, 226 and each segment of the primary coil positive turns 202, 204, 210, 212, 214, 216, a positive mutual inductance $M_{m,j}$ is established in the magnet assembly 200. Also, by the passage of electric current through each segment of the second set of secondary coil positive turns 228, 230 and each segment of the primary coil negative turns 206, 208, a negative mutual inductance $M_{n,k}$ is established in the magnet assembly 200. By adjusting the turns ration, $N_n/N_k$, between the second set of secondary coil positive turns 228, 230 and the primary coil negative turns 206, 208, as well as adjusting the turns ration, $N_m/N_j$, between the first set of secondary coil positive turns 220, 222, 224, 226 and the primary coil positive turns 210, 212, 214, 216, as well as varying the positions of the primary and secondary coil positive and negative turns, an optimized (e.g., minimized) mutual inductance, M, can be found whereby the secondary coil is non-coupling with respect to the primary coil. As an example of the turns ratios, $N_n/N_k$ and $N_m/N_j$, $$N_n/N_k = N_{228}/N_{206} = N_{230}/N_{208} = 2.3/100 \qquad (1)$$

$$N_m/N_j = (N_{220} + N_{222})/(N_{214} + N_{210} + N_{202}) = 0.5/100 \qquad (2)$$

$$= (N_{224} + N_{226})/(N_{216} + N_{212} + N_{204}) \qquad (3)$$

$$N_m/N_j = N_{222}/N_{210} = N_{226}/N_{212} = 1.8/100 \qquad (4)$$

$$N_m/N_j = N_{220}/N_{214} = N_{224}/N_{216} = 0.6/100 \qquad (5)$$

In optimizing the mutual inductance, M, certain parameters are considered, such as shielding factor, $f_s$, current coupled per year, annual homogeneity change and compensated drift. The shielding factor, $f_s$, is a dimensionless quantity expressed as a percentage. An example specification for this would be a shielding factor of between 97.5% and 102.5%. Overshielding ($f_s > 100\%$) is acceptable because it is the magnitude of change that is of interested, not the sign. This means the shift in the magnet field in the bore 234 due to a disturbance a certain distance away from the MRI machine is only 2.5% of that in free space at the same distance from the disturbance. The purpose of the $B_0$ coil is to shield the magnetic field in the imaging volume from such external effects. The design is optimized to achieve the highest possible shielding factor. The current coupled per year is the change in the secondary coil current, for a given rate of decay of current in the primary coil (e.g., 0.1 ppm/hr) expressed in Amps/year. A target value of the current coupled per year would be <0.5 Amps/year. A coupling $B_0$ coil needs to be dumped periodically which causes a shift in the field and has to be co-ordinated with imaging schedules. The field homogeneity can be decomposed into spherical harmonic components. The $Z^2$ gradient is usually the most significant component of inhomogeneity resulting from current coupled into the $B_0$ coil. The $Z^2$ gradient is a quadratic change in the polarizing magnetic field along the axis 218 of the bore 234. Since the $B_0$ coils are all axi-symmetric, no transverse terms are generated and, since they are also symmetric with respect to the mid plane 232, no odd order axial terms ($Z^1$, $Z^3$, etc.) are generated either. The $Z^2$ gradient can be expressed in ppm/year at radius of x cm for a given rate of decay of the current in the primary coil (e.g., 0.1 ppm/hr). A target value for the change in the $Z^2$ gradient would be <0.5 ppm/year expressed at a radius of 22.5 cm measured from the axis 218. The homogeneity deterioration can be reduced by improving the homogeneity of the $B_0$ coil or by reducing the coupling between the $B_0$ coil and magnet. Compensated drift is the overall rate of decay expressed in ppm/hr for the multiple body for an underlying decay of, for example, 0.1 ppm/hr in the primary coil. All superconducting magnets decay (typically <0.1 ppm/hr) and it is undesirable for the $B_0$ coil to exaggerate this effect. A target for compensated drift would be <0.105 ppm/hr for a primary coil underlying drift of 0.1 ppm/hr. An increase of >5% in the decay rate would be unacceptable.

By 'multiple body,' is meant the system of interacting coils (e.g., the main magnet plus the $B_0$ coil plus the shim coils, etc.). For example, assuming a primary coil which is drifting with a rate of decay of 0.1 ppm/hour. The addition of any secondary superconducting coil, wired as a closed loop, will result in an overall decay rate for the multiple body which is either greater or smaller than 0.1 ppm/hr, depending on the geometry of the secondary coil. The multiple body rate of decay is the rate of change in the magnetic field due to changes of current in the primary coil, the secondary coil and shim coils.

A genetic algorithm, driven from a spreadsheet, may be used for optimization, interfacing with appropriate software to calculate inductances, mutual inductances, field strengths, etc. Genetic algorithms are less susceptible to getting stuck at local optima than gradient search methods. The number of turns and axial locations of each axi-symmetric pair of coils are optimized although, in an example below, the size and the locations of the $B_0$ coils were restricted within the optimization routine to allow convenient manufacture (e.g., the $B_0$ coils 220, 222, 224, 226, 228, 230 are allowed to reside directly above existing primary coils 214, 210, 216, 212, 206, 208 to avoid the need for additional formers and winding journals onto which the coil is wound.)

Both mutual inductance and shielding performance are dependent on the axial/radial positions of the primary and $B_0$ coils, and the number of turns in each coil; though the number of turns in the primary coil may be considered to be fixed and the number of turns in the $B_0$ coil is designed around the primary coil. However, the mutual inductance is primarily influenced by the ratio of turns between the inner $B_0$ coil and the outer $B_0$ coil ($N_{228}/N_{220}+N_{222}$) because the mutual inductance between a small secondary coil inside the helium vessel and the primary coil tends to be reasonably consistent for a range of axial locations on a given radius. Therefore, changing the ratio of turns influences the overall mutual inductance more than changing axial coil positions.

It is possible to design a $B_0$ coil that has turns wound only over the bucking coil 206, 208. Additional $B_0$ coils on the inner former coils are to reduce mutual inductance between the $B_0$ coil and the primary magnet.

To show that a non-coupling secondary coil can still have a screening effect, a theoretical experiment was performed in which a primary (actively shielded) magnet and $B_0$ were excited independently by shifting the current in a small coil positioned on axis, 5 meters from the mid plane. This small coil simulates the effect of a passing truck or other machinery. The reaction of the primary magnet was a field shift of −0.00006 Tesla (rn, and the reaction of the $B_0$ was a field shift of −0.00053 T. The field shift at 5 m from this coil in free space is 0.00059 T. (0.00059 T−0.00006 T−0.00053 T=0.0 T. i.e. there is no net field shift). Thus, in this example, the primary (actively shielded) magnet only partially shielded the effect and the $B_0$ coil performs the remaining compensation.

Because the magnetic field created by magnet assembly 200 is greatly influenced by, among other things, the accuracy used in manufacturing the MRI magnet and the environment in which the MRI magnet is placed, correction of the inhomogeneities in the magnetic field is usually performed for each individual MRI magnet assembly after it has been installed in the environment in which it is to be used (e.g., a hospital or laboratory). This correction can be accomplished using any known method to determine the appropriate $B_0$ coil configuration(s) needed to ensure a uniform $B_0$ magnetic field.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. A magnetic resonance imaging magnet assembly comprising:
    a primary coil including:
        a first set of turns having a first proscribed number of turns about an axis, the first set of turns being symmetrically positioned radially from the axis and longitudinally with respect to a mid plane perpendicular to the axis;
        a second set of turns having a second prescribed number of turns about the axis, the second set of turns being symmetrically positioned radially from the axis and longitudinally with respect to the mid plane outward of the first set of turns;
    a secondary coil including:
    a third set of turns having a third prescribed number of turns about the axis, the third set of turns being symmetrically positioned radially from the axis and longitudinally with respect to the mid plane in close proximity to the first set of turns and outward of the first set of turns; and
    a fourth set of turns having a fourth prescribed number of turns about the axis, the fourth set of turns being symmetrically positioned radially from the axis and longitudinally with respect to the mid plane in close proximity to the second sot of in turns and outward or the second and third sets of turns;
    wherein the first and third sets of turns are in a first prescribed turns ratio and the second and fourth sets of turns are in a second prescribed turns ratio.

2. The magnet assembly as sot forth in claim 1 wherein the first and second sets of turns are electrically connected together in series as a primary closed loop and the third and forth sets of turns and electrically connected together in series as a secondary closed loop.

3. The magnet assembly as set forth in claim 1 wherein the first prescribed turns ratio is approximately 0.5 turns in the third set of turns per 100 turns in the first set of turns.

4. The magnet assembly as set forth in claim 1 wherein the second prescribed turns ratio is approximately 2.3 turns in the fourth set of turns por 100 turns in the second set of turns.

5. A method of shielding a polarizing magnetic field in a magnetic resonance imaging actively shicldcd magnet assembly from external magnetic disturbances, the method comprising:
    winding a primary coil about an axis, the primary coil including:
        a first set of turns having a first prescribed number of turns about the axis, the first set of turns being symmetrically positioned radially from the axis and longitudinally with respect to a mid plane perpendicular to the axis;
        a second set of turns having a second prescribed number of turns about the axis, the second set of turns being symmetrically positioned radially from the axis end longitudinally with respect to the mid plane outward of the first set of turns;
    winding a secondary coil about the axis, the secondary coil including:

a third set of turns having a third prescribed number of turns about the axis, the third set of turns being symmetrically positioned radially from the axis and longitudinally with respect to the mid plane in close proximity to the first set of turns and outward of the first sot of turns; and a fourth set of turns having a fourth prescribed number of turns about the axis, the fourth set of turns being symmetrically positioned radially from the axis and longitudinally with respect to the mid plane in close proximity to the second set of turns and outward of the second and third sets of turns;

wherein the first and third sets of turns are in a first prescribed turns ratio and the second and fourth acts of turns are in a second prescribed turns ratio.

6. The method as set forth in claim 5 wherein the first and second sets of turns are electrically connected together in series as a primary closed loop and the third and forth sets of turns and electrically connected together in series as a secondary closed loop.

7. The method as set forth in claim 5 wherein the first prescribed turns ratio is approximately 0.5 turns in the third set of turns per 100 turns in the second set of turns.

8. The method as set forth in claim 5 wherein the second prescribed turns ratio is approximately 2.3 turns in the fourth sot of turns per 100 turns in the second set of turns.

9. A magnetic resonance imaging system comprising:
  a magnet assembly including:
    a primary coil including:
      a first set of turns having a first prescribed number of turns about an axis, the first set of turns being symmetrically positioned radially from the axis and longitudinally with respect to a mid plane perpendicular to the axis;
      a second set of turns having a second prescribed number of turns about the axis, the second set of turns being symmetrically positioned radially from the axis and longitudinally with respect to the mid plane outward of the first set of turns;
    a secondary coil including:
      a third set of turns having a third prescribed number of turns about the axis, the third set of turns being symmetrically positioned radially from the axis and longitudinally with respect to the mid plane in close proximity to the first set of turns and outward of the first set of turns;
      a fourth set of turns having a fourth prescribed number of turns about the axis, the fourth set of tunis being symmetrically positioned radially from the axis and longitudinally with respect to the mid plane in close proximity to the second set of turns and outward of the second and third sets of turns;
    wherein the first and third sets of turns are in a first prescribed turns ratio and the second and fourth sets of turns are in a second proscribed turns ratio;
  an operator console in communication with a computer system enabling an operator to control the production and display of images on a screen;
  a set of gradient amplifiers for producing a act of magnetic field gradients in the magnet assembly
  a system control unit in comnmnkntion with the operator console, the set of gradient amplifiers and the computer system
  a physiological acquisition controller receptive of signals from a patient positioned in the magnet assembly, the physiological acquisition controller in communication with the system controller; and
  an interface system in communication with the magnet assembly and the system control unit, the interface system including:
    a scan room interface and patient positioning system for positioning the patient within the magnet assembly; and
    a transmit/receive switch for switching the magnet assembly to operate in a transmit or receive mode; and
    a set of amplifiers in communication with the system control unit and the transmit/receive switch.

10. The magnet assembly as set forth in claim 9 wherein the first and second sets of turns are electrically connected together in series as a primary closed loop and the third and forth sets of turns and electrically connected together in series as a secondary closed loop.

11. The magnet assembly as set forth in claim 9, wherein the first prescribed turns ratio is approximately 0.5 turns in the third set of turns per 100 turns in the first act of turns.

12. The magnet assembly as set forth in claim 9 wherein the second prescribed turns ratio is approximately 2.3 turns in the fourth set of turns per 100 turns in the second set of turns.

* * * * *

UNITED STATES PATENT AND TRADEMARK OFFICE
CERTIFICATE OF CORRECTION

PATENT NO. : 6,822,451 B2
APPLICATION NO. : 10/064619
DATED : November 23, 2004
INVENTOR(S) : Timothy James Hollis It is certified that error appears in the above-identified patent and that said Letters Patent is hereby corrected as shown below:

Title Page (54):
After "MAGNETIC" delete "SHEILDING" and insert therefor -- SHIELDING --

Column 1:
Line 1, after "MAGNETIC" delete "SHEILDING" and insert -- SHIELDING --
Line 63, after "This" insert -- is --

Column 6:
Line 22, after "of" (second occurrence) delete "interested" and insert therefor -- interest --

Column 7:
Line 41, after "Tesla" delete "(rn," and insert therefor -- (T) --

Column 8:
Line 33, after "second" delete "sot of in" and insert therefor -- set of --
Line 33, after "outward" delete "or" and insert therefor -- of --
Line 38, after "a" delete "sot" and insert therefor -- set --

Column 9:
Line 18, after "and" (second occurrence) delete "forth" and insert therefor -- fourth --

UNITED STATES PATENT AND TRADEMARK OFFICE
CERTIFICATE OF CORRECTION

PATENT NO. : 6,822,451 B2
APPLICATION NO. : 10/064619
DATED : November 23, 2004
INVENTOR(S) : Timothy James Hollis It is certified that error appears in the above-identified patent and that said Letters Patent is hereby corrected as shown below:

Column 10:
Line 3, before "being" delete "tunis" and insert therefor -- turns --
Line 14, after "a" (second occurrence) delete "act" and insert therefor -- set --
Line 16, after "in" delete "comnmnKntion" and insert therefor -- communication --
Line 37, before "sets" delete "forth" and insert therefor -- fourth --

Signed and Sealed this

Eighteenth Day of July, 2006

JON W. DUDAS
*Director of the United States Patent and Trademark Office*